United States Patent
Kitazaki

(10) Patent No.: US 7,307,893 B2
(45) Date of Patent: Dec. 11, 2007

(54) SEMICONDUCTOR DEVICE AND METHOD FOR CONTROLLING THE SAME

(75) Inventor: Kazuhiro Kitazaki, Tokyo (JP)

(73) Assignee: Spansion LLC, Sunnyvale, CA (US)

( * ) Notice: Subject to any disclaimer, the term of this patent is extended or adjusted under 35 U.S.C. 154(b) by 34 days.

(21) Appl. No.: 11/228,976

(22) Filed: Sep. 16, 2005

(65) Prior Publication Data

US 2006/0109711 A1    May 25, 2006

Related U.S. Application Data

(63) Continuation of application No. PCT/JP2004/014326, filed on Sep. 30, 2004.

(51) Int. Cl.
*G11C 7/00* (2006.01)
(52) U.S. Cl. ............. 365/189.04; 365/191; 365/185.16
(58) Field of Classification Search ........... 365/189.04, 365/191, 185.16, 185.18
See application file for complete search history.

(56) References Cited

U.S. PATENT DOCUMENTS

| | | | |
|---|---|---|---|
| 3,152,322 A * | 10/1964 | Lawrence | 360/62 |
| 5,121,036 A | 6/1992 | Fuji | 307/303 |
| 5,526,305 A * | 6/1996 | Levi | 365/174 |
| 5,656,946 A * | 8/1997 | Sim | 326/21 |
| 5,757,816 A * | 5/1998 | Al-Assadi et al. | 714/718 |
| 5,973,985 A * | 10/1999 | Ferrant | 365/230.05 |
| 6,181,604 B1 * | 1/2001 | Lu et al. | 365/185.22 |
| 6,465,818 B1 | 10/2002 | Katao | 257/207 |
| 6,552,927 B2 * | 4/2003 | Naji | 365/158 |
| 2003/0072176 A1 | 4/2003 | Watanabe | 365/185 |
| 2004/0008543 A1 | 1/2004 | Kato | 365/189 |

* cited by examiner

*Primary Examiner*—Connie C. Yoha

(57) ABSTRACT

A semiconductor memory device has a read ground and a write ground, these grounds being separately provided. Even when the read and verify operations are simultaneously executed, the source potential of an involved memory cell obtained at this time is equal to that obtained when either one of the read and verify operations is executed. Thus, the semiconductor memory device can perform the read operation at high speed with a sufficient operating margin regardless of whether the device is in the dual operation mode or not.

10 Claims, 5 Drawing Sheets

Fig. 4(a)

| | | 状態 |
|---|---|---|
| READ ADDRESS SWITCH | AR0 | OFF |
| | AR1 | ON |
| | AR2 | OFF |
| | AR3 | OFF |
| WRITE ADDRESS SWITCH | AW0 | OFF |
| | AW1 | OFF |
| | AW2 | ON |
| | AW3 | OFF |
| READ DATA SWITCH | DR0 | OFF |
| | DR1 | ON |
| | DR2 | OFF |
| | DR3 | OFF |
| WRITE DATA SWITCH | DW0 | OFF |
| | DW1 | OFF |
| | DW2 | ON |
| | DW3 | OFF |
| READ SOURCE SWITCH | SR0 | OFF |
| | SR1 | ON |
| | SR2 | OFF |
| | SR3 | OFF |
| WRITE SOURCE SWITCH | SW0 | OFF |
| | SW1 | OFF |
| | SW2 | ON |
| | SW3 | OFF |

Fig. 4(b) (Prior Art)

| | | 状態 |
|---|---|---|
| READ ADDRESS SWITCH | AR0 | OFF |
| | AR1 | ON |
| | AR2 | OFF |
| | AR3 | OFF |
| WRITE ADDRESS SWITCH | AW0 | OFF |
| | AW1 | OFF |
| | AW2 | ON |
| | AW3 | OFF |
| READ DATA SWITCH | DR0 | OFF |
| | DR1 | ON |
| | DR2 | OFF |
| | DR3 | OFF |
| WRITE DATA SWITCH | DW0 | OFF |
| | DW1 | OFF |
| | DW2 | ON |
| | DW3 | OFF |
| SOURCE SWITCH | S0 | OFF |
| | S1 | ON |
| | S2 | ON |
| | S3 | OFF |

SEMICONDUCTOR DEVICE AND METHOD FOR CONTROLLING THE SAME

CROSS REFERENCE TO RELATED APPLICATIONS

This is a continuation of International Application No. PCT/JP2004/014326, filed Sep. 30, 2004.

BACKGROUND OF THE INVENTION

1. Field of the Invention

The present invention relates to a semiconductor device, and more particularly, a technique for achieving high-speed operation and a sufficient operating margin of a semiconductor memory having a dual operation function.

2. Description of the Related Art

Recently, the flash memory has come into wide use as an electrically rewritable semiconductor memory device. The flash memory is categorized into the NAND type used for data storage that is typically the memory card, and the NOR type that stores a program and is built in electronic devices. The typical NOR type flash memory stores data ("1" or "0") based on whether the charge is stored in the floating gate. The unit cell of the NOR type flash memory is composed of a single MOS transistor, which is equipped with a control gate (upper gate) and a floating gate (lower gate).

In read operation in which data is read from a specified memory cell, a positive bias (for example, 5 V) is applied to the control gate of the selected memory cell, and a bias approximately equal to 1 V is applied to the drain thereof from the sense amplifier. The charge stored in the floating gate cancels the bias applied to the control gate, and the memory cell does not allow current to pass therethrough, so that (nonconducting) data "0" can be read. In contrast, when no charge is in the floating gate, the charge is not canceled by the bias applied to the control gate, and the memory cell allows current to pass therethrough, so that (conducting) data "1" can be read. The sense amplifier senses the current thus produced, and selectively voltages corresponding to "0" and "1". At that time, as the difference between cell current $I_{c1}$ for data "1" and cell current $I_{c0}$ for data "0" becomes greater, the sense amplifier reads data more easily, so that the semiconductor device can operate faster with the greater operating margin.

FIG. 1 is a block diagram of a configuration of the sense amplifier. A selected memory cell 11a is connected to a sense amplifier 13a via a decoder 12a. A reference cell 11b for data reference is connected to a sense amplifier 13b via a decoder 12b. The sense amplifiers 13a and 13b are connected to a differential sense amplifier 17, so that the memory cell 11a can be operatively coupled with the reference cell 11b. In FIG. 1, reference numerals 14a and 14b, 15a and 15b, and 16a and 16b indicate source switches, parasitic resistances, and grounds (GND) respectively connected to the memory cells 11a and 11b.

There is the parasitic resistance 15a between the memory cell 11a and GND 16a due to an interconnection line provided therebetween. When cell current $I_c$ flows through the parasitic resistance 15a, the potential of the source switch 14a connected to the memory cell 11a is not the GND level but is equal to Vs (=$I_c \cdot R$) where $V_s$ is the product of the resistance value R and the cell current $I_c$. Generally, the memory cell is n-channel transistor, and the cell current $I_c$ is described as $Ic=\beta \cdot V_{ds}(V_{gs}-V_t-V_{ds}/2)$ where $\beta$ is the proportionality constant, $V_{gs}$ is the gate-source voltage, $V_{ds}$ is the drain-source voltage, and $V_t$ is the threshold voltage.

According to the above equation, as the source potential $V_s$ raises, the gate-source voltage $V_{gs}$ and the drain-source voltage $V_{ds}$ decrease, so that the cell current $I_c$ is decreased. With the miniaturization of the device, the cell current Ic inevitably decreases. Thus, as the device is more miniaturized, the read operation is more affected by variation of the source potential $V_s$.

In the conventional flash memory, data rewriting is slow and the usability is poor as compared to the DRAM or SRAM because of the following. In the flash memory, read operation by the processor is not allowed when programming or erasing is in progress. The status register of the flash memory should be periodically checked by polling in order to determine whether programming or erasing is completed prior to the read operation on the flash memory. The dual operation function copes with these problems and allows data to be read while data is programmed or erased (rewritten).

FIG. 2 is a block diagram of an internal configuration of the conventional flash memory equipped with the dual operation function that enables simultaneous operations. In this configuration, the memory cell array is divided into several banks (four banks in the present example). When one of the banks is involved in data rewriting, data can be simultaneously read from another bank.

A memory cell array 200 has four banks, namely, a zeroth bank 201, first bank 202, second bank 203 and third bank 204. The memory cell array 200 further includes read address switches and write address switches (AR0-AR3 and AW0-AW3) for address read (AR) and address write (AR), read data switches and data write switches (DR0-DR3 and DW0-DW3) for data read (DR) and data write (DW), source switches S0-S3, a data read sense amplifier block 207, a data write sense amplifier block 208, an address buffer 209, a controller 210, and I/O terminals 213. The read address switches AR0-AR3 are respectively provided to the banks, and the write address switches AW0-AW3 are respectively provided to the banks. The read data switches DR0-DR3 are respectively provided to the banks, and the write data switches DW0-DW3 are respectively provided to the banks. The source switches S0-S3, which are respectively provided to the four banks and are connected to a ground terminal 212, function to connect the banks to a read reference 205 and/or a write reference 206. The data read sense amplifier block 207 has a data read sense amplifier 207a, and an output circuit 207b, and is connected to the read reference 205. The data write sense amplifier block 208 includes a write sense amplifier 208a, a write circuit 208b, and an erase circuit 208c, and is connected to the write reference 206. The address buffer 209 is connected to address terminals 211 and is accessible to the four banks. The controller 210 is connected to the data read sense amplifier block 207, the data write sense amplifier block 208, and the address buffer 209. The I/O terminals 213 are connected to the output circuit 207b of the data read sense amplifier block 207 and the write circuit 208b of the data write sense amplifier block 208.

The memory cell array 202 has a configuration that realizes the dual operation function in which data can be read when programming or erasing is in progress. This configuration enables each of the banks 201-204 to be selectively connected to the read circuit and the write circuit. More specifically, one of the banks is connected to the read circuit, and another bank is simultaneously connected to the write circuit. Then, the read operation is executable while the write operation is being carried out.

The write operation includes a verify operation in which it is determined whether programming or erasing progresses to a respective given level. The verify operation is essentially the same as the read operation. There is a case where the read operation is carried out during the verify operation. However, this case flows a larger current than the current that flows when either the verify operation or the read operation is carried out in the circuit configuration in which the ground line is used commonly to the read and write operations. The larger current develops a larger voltage drop across the parasitic resistance. Thus, the source potential of the specified memory cell in the read or write operation becomes higher than that obtained when only one of the read and verify operations is executed. This reduces the cell current. As a result, the read speed and the margin are degraded in the read or verify operation.

SUMMARY OF THE INVENTION

The present invention has an object of overcoming the above-mentioned problems of the conventional flash memory equipped with the dual-operation function and providing a technique capable of assuring high-speed operation and sufficient operating margin regardless of the dual operation mode.

This object of the present invention is achieved by a semiconductor device simultaneously operable in first and second operating modes including: a first ground line via which an internal circuit of the semiconductor device is grounded in the first operating mode; and a second ground line via which the internal circuit is grounded in the second operating mode.

The semiconductor device may further include a first ground terminal connected to the first ground line, and a second ground terminal connected to the second ground line.

The semiconductor device may be configured so that the first ground line and the second ground line have a substantially equal length.

The semiconductor device may further include a switch that selectively connects one of the first and second ground lines to the internal circuit.

The semiconductor device may be configured so that the internal circuit comprises banks to which the first and second ground lines are commonly provided.

The semiconductor device may be configured so that: the internal circuit comprises banks; and the semiconductor device comprises switches that selectively connect the banks to the first and second ground lines.

The semiconductor device may be configured so that the banks include non-volatile memory cells.

The semiconductor device may be configured so that the first and second modes are a data read mode and a data write mode, respectively.

The semiconductor device may be configured so that: the internal circuit comprises banks having memory cells; a first one of the banks operates in the first mode, and a second one of the banks operates in the second mode; and the first one of the banks is connected to the first ground line, and the second one of the banks is connected to the second ground line.

The semiconductor device may be configured so that the first and second modes are a data read mode and a data write mode, respectively.

The semiconductor device may be configured so that the semiconductor device is a non-volatile semiconductor device.

The present invention includes a method of controlling a semiconductor device simultaneously operable in first and second operating modes comprising the steps of: grounding an internal circuit of the semiconductor device via a first ground line in the first operating mode; and grounding the internal circuit via a second ground line in the second operating mode.

BRIEF DESCRIPTION OF THE DRAWINGS

FIGS. 4A and 4B show the status of each switch when a first bank becomes involved in reading when writing of a second bank is in progress in the flash memory shown in FIGS. 2 and 3.

DESCRIPTION OF THE PREFERRED EMBODIMENTS

A semiconductor memory device according to an aspect of the present invention will now be described with reference to the accompanying drawings. In the semiconductor memory device in the following description is a NOR type flash memory.

Figure 3:
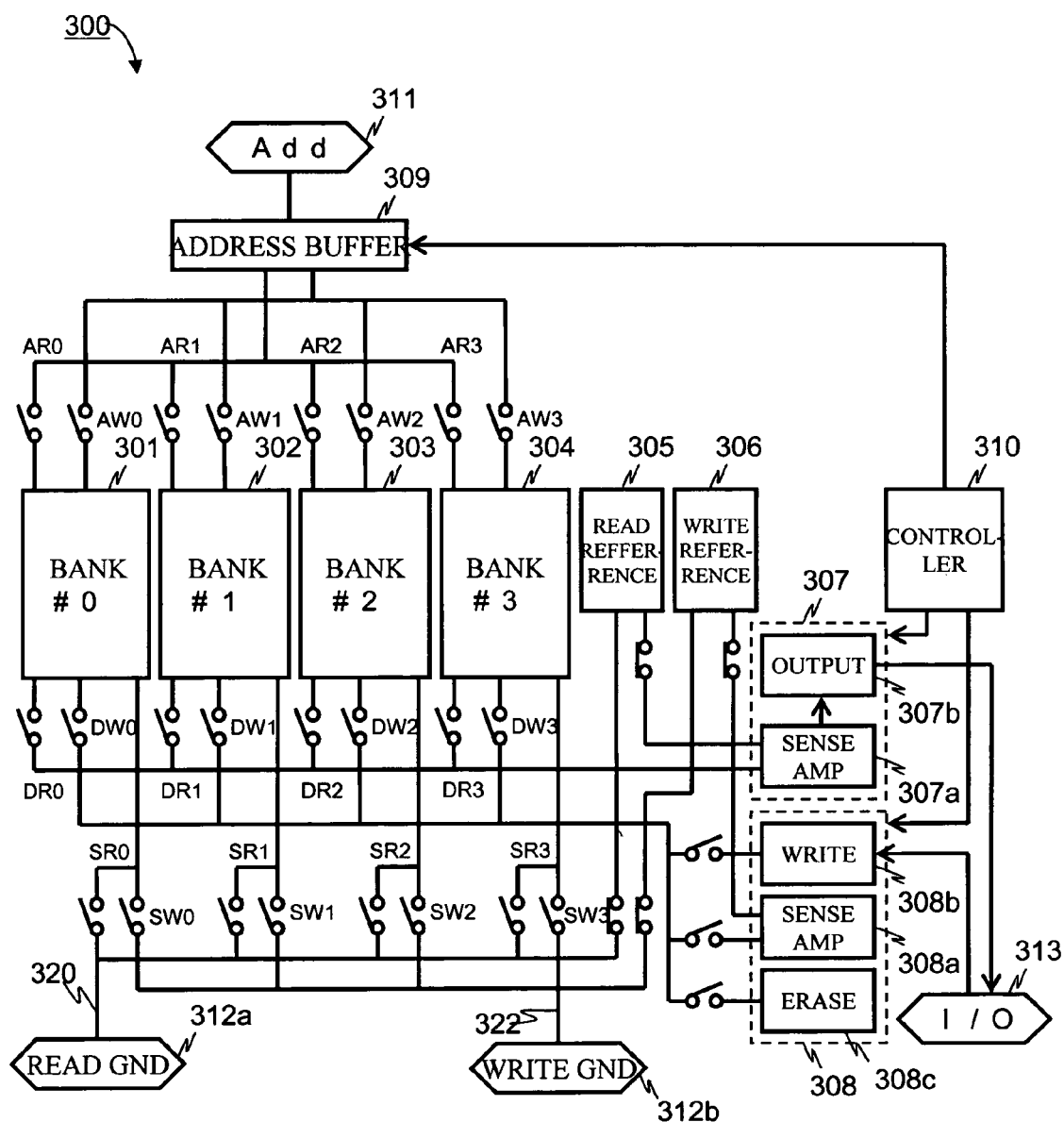
FIG. 3 is a block diagram of an internal configuration of a flash memory according to an aspect of the present invention.

FIG. 3 is a block diagram of an internal configuration of the flash memory according to an aspect of the present invention. The flash memory is separately equipped with a read ground 312a and a write ground 312b for verification. This makes the source potential of the memory cell equal to that obtained when only one of the read and verify operations is executed even when the read and verify operations are concurrently executed. It is thus possible to realize high-speed read operation stabilized due to an enhanced read margin irrespective of whether the device is in the dual operation mode.

A memory cell array 300 has four banks of a zeroth bank 301, a first bank 302, a second bank 303 and a third bank 304. The memory cell array 200 further includes read address switches and write address switches (AR0-AR3 and AW0-AW3) for address read (AR) and address write (AW), read data switches and data write switches (DR0-DR3 and DW0-DW3) for data read (DR) and data write (DW), read source switches SR0-SR3, write source switches SW0-SW3, a data read sense amplifier block 307, a data write sense amplifier block 308, an address buffer 309, a controller 310, and I/O terminals 313. The read address switches AR0-AR3 are respectively provided to the banks, and the write address switches AW0-AW3 are respectively provided to the banks. The read data switches DR0-DR3 are respectively provided to the banks, and the write data switches DW0-DW3 are respectively provided to the banks. The read source switches SR0-SR3, which are respectively provided to the four banks and are connected to a read ground terminal 312a, function to connect the banks to a read reference 305 and/or a write reference 306. The write source switches SW0-SW3, which are respectively provided to the four bands and are connected to a write ground terminal 312b, function to connect the banks to the read reference 305 and/or the write reference 306. The data read sense amplifier block 307 has a data read sense amplifier 307a, and an output circuit 307b, and is connected to the read reference 305. The data write sense amplifier block 308 includes a write sense amplifier 308a, a write circuit 308b, and an erase circuit 308c, and is connected to the write reference 306. The address buffer 309 is connected to address terminals 311 and is accessible to the four banks. The controller 310 is connected to the data read sense amplifier block 307, the data write sense amplifier block 308, and the address buffer 309. The I/O terminals 313 are connected to the output circuit 307b of the data read sense amplifier block 307 and the write circuit 308b of the data write sense amplifier block 308.

In the exemplary configuration shown in FIG. 3, the cell array is divided into four banks (301-304), each of which is provided with a not-shown decoder circuit. In each bank, the read operation is executable unless the bank is in the write status. The address for read is specified and applied to the address terminals 311. The address is then output as a read address, via the address buffer 309. The controller 310 controls the switches so that the read address is transmitted to only the selected bank. The bank selected by the read address selects the memory cell specified by the read address through the decoder. The controller 310 controls the switches so that only the selected bank is connected to the sense amplifier 307a of the read circuit. The data in the specified memory cell is identified by the sense amplifier 307a, and the result of this identification is output to the I/O terminals 313 via the output circuit 307b, and the read operation is finished. In the read operation, the ground line 320 through which the cell current flows is connected to the read ground terminal 312a, while no current flows through the write ground terminal 312b. The ground line 322 through which the cell current flows is connected to the write ground terminal 312b. The ground lines 320 and 322 are each connected commonly to the banks 301 through 304. The read ground terminal 312a is connected to the ground line 320, and the write ground terminal 312b is connected to the ground line 322. Although the ground lines 320 and 322 may have different lengths, preferably, these lines have an equal length. The read ground terminal 312a and the write ground terminal 312b may be separate external connection terminals or may be connected together to form a single external connection terminal. In the latter case, the group of switches for write and the group of switches for read are preferably arranged as close to the single external connection terminal as possible. The read and write operations may be defined as first and second modes, respectively.

When the device is subjected to writing, the controller 310 causes the address buffer 309 to the write address, and controls the switches so that the write address is sent to only the selected bank. Simultaneously, the controller 310 controls the switches so that the sense amplifier 308a, the write circuit 308b and the erase circuit 308c of the write circuit are connected as necessary. In the selected bank, rewriting of data in the memory cell indicated by the specified address is carried out. It is now assumed that the read operation is activated during the verify operation. The address to be read during the verify operation is applied to the address terminals 311. The controller 310 controls the address buffer 309 and the switches so that the applied address is transmitted, as the read address independent of the verify address, to only the bank specified for read. After that, the bank selected for read selects the corresponding memory cell and connects the memory cell to the sense amplifier 307a as in the case of the aforementioned read operation. Then, a decision on data is made. The data thus identified is applied to the I/O terminals 313. At that time, the cell current in the read operation and the cell current in the verify operation respectively flow through the read ground terminal 312a and the write ground terminal 312b. It is to be noted that the above two currents flow through the separate paths, and are the same as those obtained when only the read operation or the write operation is carried out. That is, there is no increase in the amount of current that occurs in the conventional dual operation.

Figure 1:
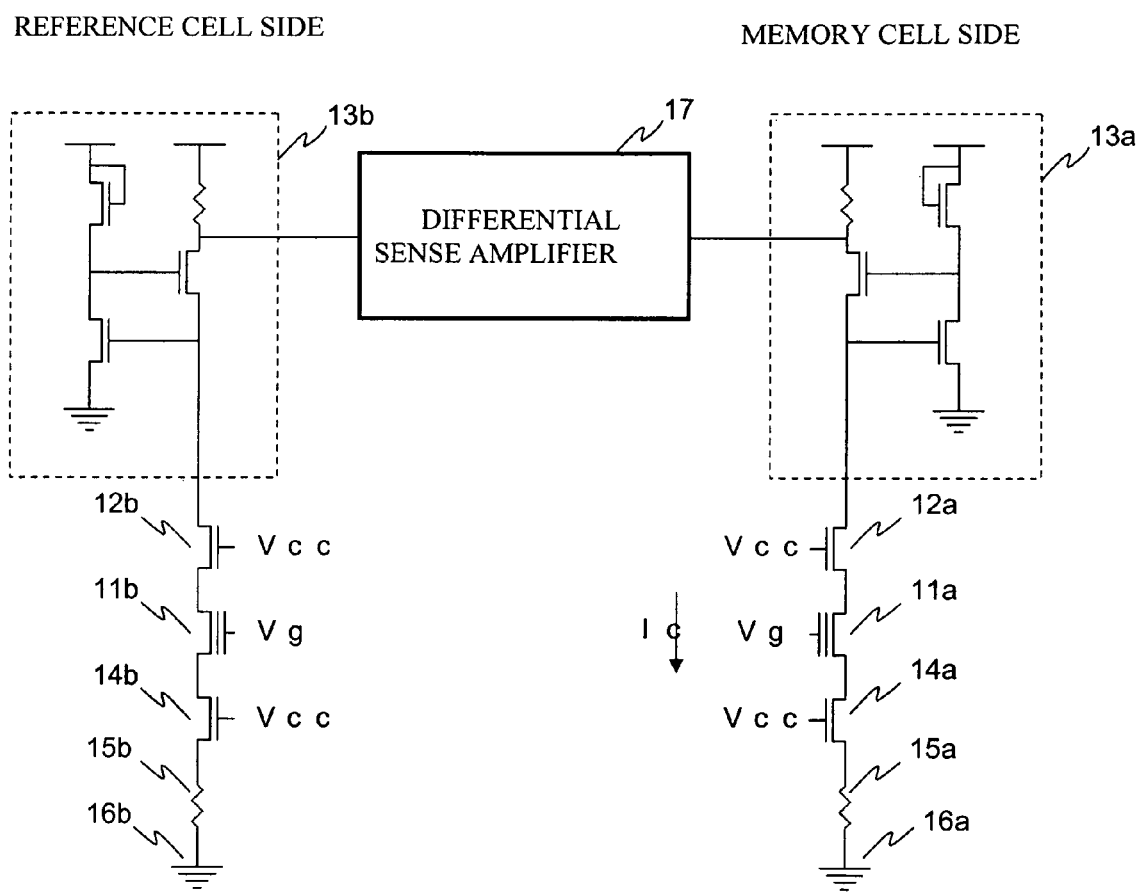
FIG. 1 is a block diagram of a configuration of the sense amplifier.
Figure 2:
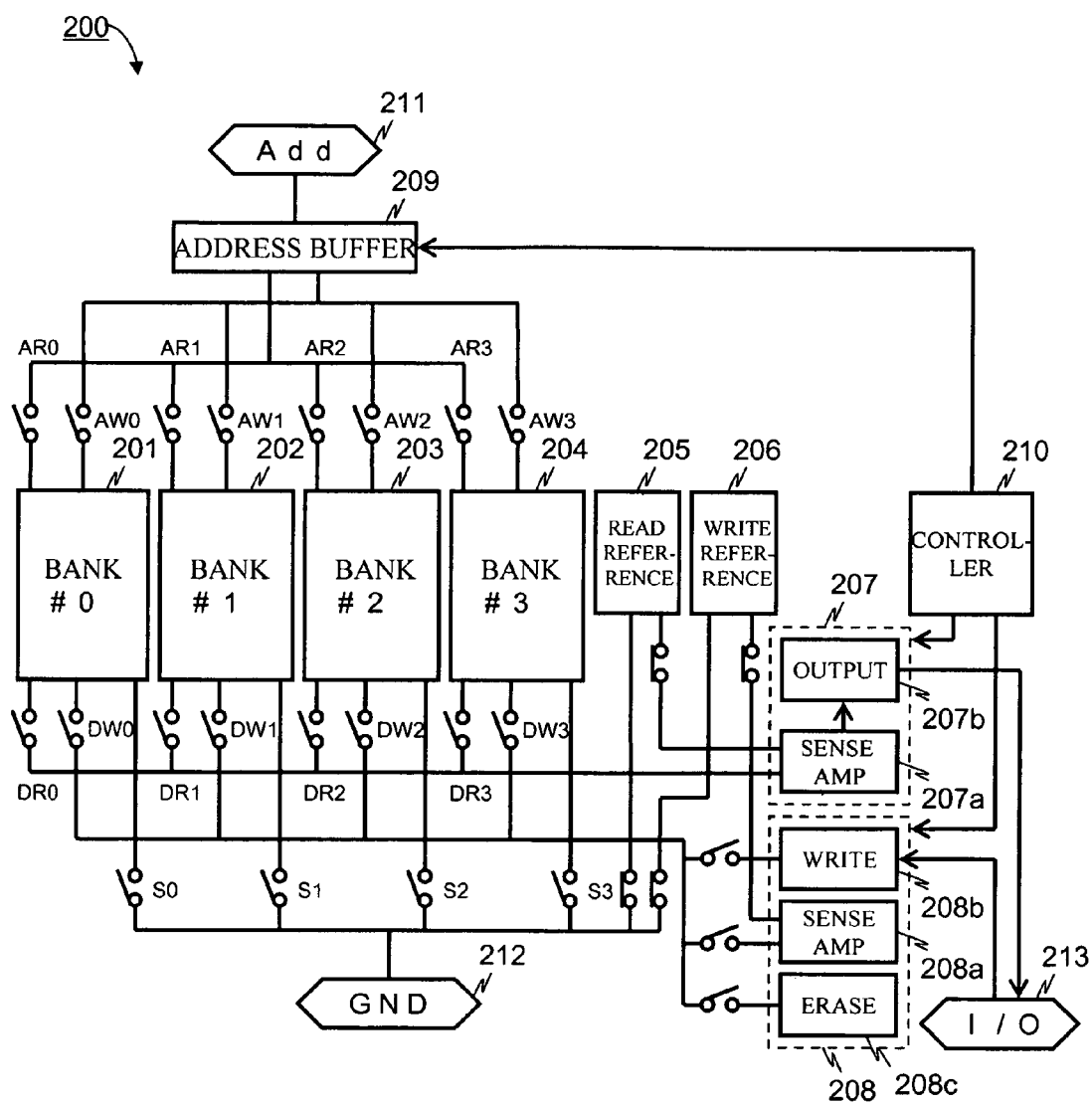
FIG. 2 is a block diagram of an internal configuration of a conventional flash memory equipped with a dual operation function that enables simultaneous operations.
Figure 5A:
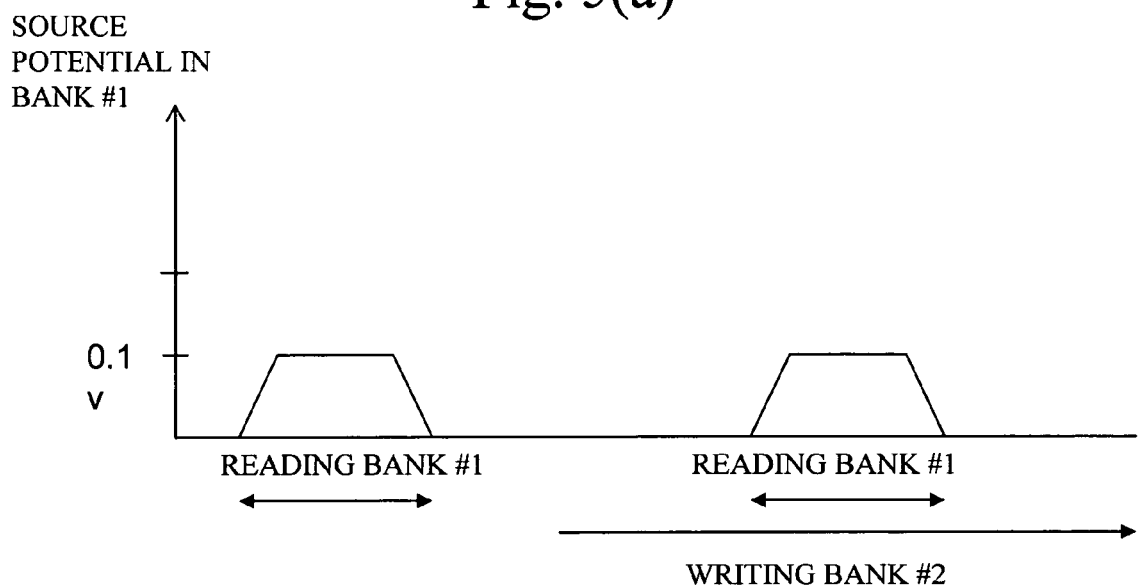
FIGS. 5A and 5B show the source potentials observed when the second bank becomes involved in reading when writing of a third bank is in progress.
Figure 5B:
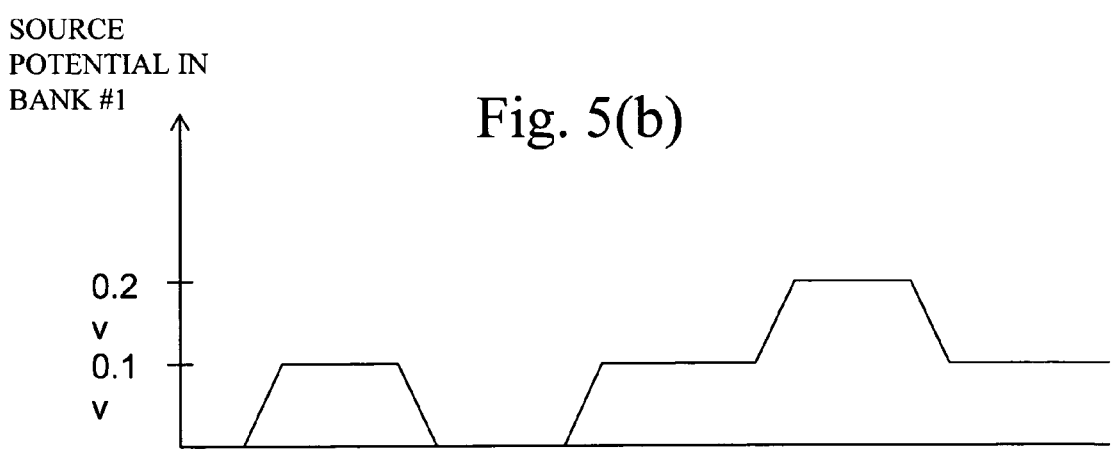

FIG. 4(a) shows the states of the switches observed when the read operation on the first bank 302 of the flash memory shown in FIG. 3 is executed while the second bank 303 is involved in the write operation. The same operations as those shown in FIG. 4A take place in the other arbitrary combinations of the banks involved in the dual operation mode. For comparison, FIG. 4(b) shows the states of the switches observed when the read operation on the first bank 202 of the conventional flash memory shown in FIG. 2 is executed while the second bank 203 is involved in the write operation. FIGS. 5(a) and 5(b) show the source potentials observed when the read operation on the first bank is executed while the write operation on the second bank is being performed (which correspond to the states of the switches shown in FIGS. 4(a) and 4(b).

Referring to FIG. 4(a), the write address switch AW2 and write data switch DW2 of the second bank 303 into which data are being written are ON, and the address buffer 309 and the write reference 306 are electrically connected. When the write source switch SW2 is turned ON, the second bank 303 is connected to the write ground 312b. On the other hand, the read address switch SR1 and the read data switch DR1 of the first bank 302 from which data are being read are ON, and the address buffer 309 and the read reference 305 are electrically connected. When the read switch SR1 is turned ON, the first bank 302 is connected to the read ground 312a. The other switches are all OFF.

When the read operation on the first bank 302 is executed, the address of the memory cell in the first bank 302 is applied to the address terminals 311, and is output as the read address through the address buffer 309. The controller 310 controls the switches in the manner shown in FIG. 4(a) so that the read address is transmitted to only the first bank 302. The controller 310 controls the switches so that only the selected first bank 302 is connected to the sense amplifier 307a for read. The sense amplifier 307a makes a decision on the data of the memory cell, and supplies the result of decision to the I/O terminals 313 through the output circuit 307b. In this manner, the read operation is performed. In the read operation, the ground line 320 through which the cell current flows is connected to the read ground terminal 312a, while no current flows through the write ground terminal 312b.

When the second bank 303 is involved in the write operation (programming or erasing), the controller 310 causes the address buffer 309 to output the write address, and controls the switches so that the write address is transmitted to only the selected second bank 303. Simultaneously, the controller 310 controls the switches so that the sense amplifier 308a, the write circuit 308b and the erase circuit 308c in the write circuit are connected as necessary. The selected second bank 303 rewrites the data of the memory cell identified by the specified address. When the read operation is executed while the verify operation is in progress, the address is externally applied to the address terminals 311. The controller 310 controls the address buffer 309 and the switches so that the applied address is transmitted, as the read address independent of the verify address, to only the first bank 302 selected for read. After that, the memory cell in the first bank 302 is selected and connected to the sense amplifier 307a as in the case of only the read operation. Then, a decision on data is made, and data thus identified is output to the I/O terminals 313. At that time, the cell current in the read operation and the cell current in the verify operation flow through the read ground terminal 312*a* and the write ground terminal 312*b*. It is to be noted that these cell currents flow through the independent paths and have the amounts of currents equal to those obtained in only the read operation or write operation. Thus, there is no increase in the current in the dual operation mode.

As described above, according to the present invention, the read ground 312*a* and the write ground 312*b* for verification are separately provided. As shown in FIG. 5(*a*), even when the read and verify operations are simultaneously performed, the source potentials of the memory cells are equal to those obtained when only one of the read and verify operations is performed, and the stable read operation with an improved margin can be performed at higher speed regardless of the dual operation mode.

In contrast, the convention structure shown in FIG. 4(*b*) uses the ground line shared by the read and write operations. This flows a large amount of current flowing through the ground line in the dual operation mode and develops a large voltage drop across the parasitic resistance, as compared to that obtained when only one of the read and verify operations is executed. Thus, as shown in FIG. 5(*b*), the source potentials of the memory cells involved in the read and write operations simultaneously performed are higher than those obtained when either the read operation or the write operation is performed. This reduces the cell current.

As has been described, the semiconductor memory device of the present invention is capable of performing the read operation at higher speed with a sufficient operating margin regardless of whether the device is in the dual operation mode or not.

The present invention provides the unique technique that enables to perform the read operation at higher speed with a sufficient margin of the semiconductor device with the dual operation function. The present invention is not limited to the semiconductor memory device such as a flash memory but includes a semiconductor device including a memory part such as a system LSI.

What is claimed is:

1. A semiconductor device simultaneously operable in data read and data write modes, the semiconductor device comprising:

an internal circuit comprising a memory cell capable of storing information;

a first ground line via which the internal circuit is grounded in the data read mode; and a second ground line via which the internal circuit is grounded in the data write mode.

2. The semiconductor device as claimed in claim 1, further comprising a first ground terminal connected to the first ground line, and a second ground terminal connected to the second ground line.

3. The semiconductor device as claimed in claim 1, wherein the first ground line and the second ground line have a substantially equal length.

4. The semiconductor device as claimed in claim 1, further comprising a switch that selectively connects one of the first and second ground lines to the internal circuit.

5. The semiconductor device as claimed in claim 1, wherein the internal circuit comprises banks to which the first and second ground lines are commonly provided.

6. The semiconductor device as claimed in claim 1, wherein:

the internal circuit comprises banks; and the semiconductor device comprises switches that selectively connect the banks to the first and second ground lines.

7. The semiconductor device as claimed in claim 5, wherein the banks include non-volatile memory cells.

8. The semiconductor device as claimed in claim 1, wherein:

the internal circuit comprises banks having memory cells;

a first one of the banks operates in the data read mode, and a second one of the banks operates in the data write mode; and the first one of the banks is connected to the first ground line, and the second one of the banks is connected to the second ground line.

9. The semiconductor device as claimed in claim 1, wherein the semiconductor device is a non-volatile semiconductor device.

10. A method of controlling a semiconductor device simultaneously operable in data read and data write modes, the semiconductor device comprising an internal circuit comprising a memory cell capable of storing information, the method comprising the steps of:

grounding the internal circuit via a first ground line in the data read mode; and grounding the internal circuit via a second ground line in the data write mode.

* * * * *